(12) United States Patent
Kim

(10) Patent No.: US 7,471,105 B2
(45) Date of Patent: Dec. 30, 2008

(54) LEVEL SHIFTER AND LEVEL SHIFTING METHOD FOR HIGHER SPEED AND LOWER POWER

(75) Inventor: Yang Ki Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 366 days.

(21) Appl. No.: 11/302,437

(22) Filed: Dec. 14, 2005

(65) Prior Publication Data
US 2006/0125521 A1 Jun. 15, 2006

(30) Foreign Application Priority Data
Dec. 15, 2004 (KR) .................. 10-2004-0106680

(51) Int. Cl.
*H03K 19/0175* (2006.01)
(52) U.S. Cl. .............................. 326/68; 326/63; 326/81; 326/80
(58) Field of Classification Search .................. 326/80, 326/81, 63, 68
See application file for complete search history.

(56) References Cited

U.S. PATENT DOCUMENTS 5,818,257 A * 10/1998 Villa ........................ 326/81
5,818,258 A * 10/1998 Choi ........................ 326/83
5,834,948 A * 11/1998 Yoshizaki et al. ........... 326/81
6,031,394 A * 2/2000 Cranford et al. ............ 326/81
6,388,499 B1 * 5/2002 Tien et al. .................. 327/333
6,844,769 B2 * 1/2005 Yamamoto et al. .......... 327/333
2003/0016054 A1 * 1/2003 Okamoto et al. ............ 326/80
2004/0222834 A1 * 11/2004 Frans et al. ................. 327/165

FOREIGN PATENT DOCUMENTS

| JP | 09-172367 | 6/1997 |
| JP | 11-274912 | 12/1999 |
| KR | 1993-0007129 | 7/1993 |
| KR | 1999-0057843 | 7/1999 |
| KR | 1020000076711 | 12/2000 |
| KR | 1020010011481 A | 2/2001 |

* cited by examiner

*Primary Examiner*—Vibol Tan
(74) *Attorney, Agent, or Firm*—Harness, Dickey & Pierce, P.L.C.

(57) ABSTRACT

A level shifter and method of level shifting between an input signal and an output signal which may realize improvement s in operating speed and reductions in power consumption. An example level shifter may include a pull-up signal generation unit outputting a pull-up signal at a voltage level that is a given voltage level higher than a voltage level of an input signal, a pull-up unit pulling-up an output signal in response to the pull-up signal to generate the output signal with a shifted level, and a pull-down unit pulling-down the output signal in response to the input signal.

12 Claims, 9 Drawing Sheets

CONVENTIONAL ART

CONVENTIONAL ART

US 7,471,105 B2

LEVEL SHIFTER AND LEVEL SHIFTING METHOD FOR HIGHER SPEED AND LOWER POWER

PRIORITY STATEMENT

This application claims foreign priority benefits under 35 U.S.C. §§ 119(a)-(d) of Korean Patent Application No. 10-2004-0106680, filed on Dec. 15, 2004 in the Korean Intellectual Property Office, the entire disclosure of which is hereby incorporated by reference.

BACKGROUND OF THE INVENTION

1. Field of the Invention

The present invention relates generally to a level shifter and level shifting method for high-speed operations and which may reduce power consumption in semiconductor devices.

2. Description of the Related Art

As process technologies develop, operating voltages of a semiconductor device and internal circuit therein continuously decrease. In addition, the internal operating voltage of the semiconductor device has been reduced in order to increase operating speed and to reduce power consumption of the semiconductor device. However, some semiconductor devices or some internal circuits therein require a high voltage due to operating characteristics. Therefore, when a semiconductor device and/or internal circuits therein which operate with a high operating voltage are used in conjunction with another semiconductor device and/or internal circuits therein that do not operate using a high voltage, a voltage interface is needed between the semiconductor devices and/or the internal circuits.

For a semiconductor device operating at a high speed, it is more difficult to implement a level shifter to shift a low level of voltage to a high level of voltage, than it is to level shift from a high level of voltage to a low level of voltage. Also, the conventional level shifter performing a voltage shift from a low-to-high voltage has problems including reduced operating speed, reduced duty ratio, and increased power consumption caused by leakage current.

FIG. 1 is a circuit diagram of a conventional level shifter. The level shifter includes two inverters IV1 and IV2, two NMOS transistors N1 and N2, and two PMOS transistors P1 and P2. In FIG. 1, Vin refers to an input signal, Vout refers to an output signal, V1 refers to a first supply voltage, V2 refers to a second supply voltage higher than the first supply voltage, and Vss refers to a ground voltage.

In operation, when the input signal Vin has the level of the ground voltage Vss, the NMOS transistor N1 is turned on and the NMOS transistor N2 is turned off. With NMOS transistor N1 on and NMOS transistor N2 off, the voltage at node T1 becomes the level of the ground voltage Vss and PMOS transistor P2 is turned on. With PMOS transistor P2 on, the voltage at a node T2 becomes the level of the second supply voltage V2, PMOS transistor P1 is turned off and the output signal Vout has the level of the ground voltage Vss.

When the input signal Vin has the level of the first supply voltage V1, the NMOS transistor N1 is turned off and the NMOS transistor N2 is turned on, so that the voltage at node T2 is the level of the ground voltage Vss and thus the PMOS transistor P1 is turned off. Therefore, the voltage at node T1 becomes the ground voltage Vss and the PMOS transistor P2 is turned off. Here, since the voltage at node T2 becomes the ground voltage Vss, the output signal Vout has the level of the second supply voltage V2.

FIG. 2 is a timing diagram illustrating in detail the operation of the conventional level shifter shown in FIG. 1. In FIG. 2, Vin refers to the input signal, Vout refers to the output signal, T1 refers to the voltage at the node T1, and T2 refers to the voltage at the node T2.

Referring to FIG. 2, when the input signal Vin shifts from the level of the ground voltage Vss to the level of the first supply voltage V1, the NMOS transistor N1 is turned off and the NMOS transistor N2 is turned on. Therefore, the voltage at the node T2 decreases due to the current discharged by NMOS transistor N2. When the voltage at the node T2 decreases to where it becomes equal or less than a given voltage which may be set in advance (V2-Vth, where Vth is a threshold voltage of a PMOS transistor), the PMOS transistor P1 is turned on and thus the voltage at the node T1 begins to rise. When the voltage at the node T1 exceeds V2-Vth, the PMOS transistor P2 is turned off. As a result, when the voltage at the node T2 drops below V2-Vth, the voltage level of the output signal Vout shifts (increases) to the level of the second supply voltage V2 via a second inverter IV2.

Still referring to FIG. 2, when the input signal Vin shifts from the level of the first supply voltage V1 to the level of the ground voltage Vss, the NMOS transistor N1 is turned on and the NMOS transistor N2 is turned off. Therefore, the voltage at node T1 decreases. Once the voltage at the node T1 drops below V2-Vth, the PMOS transistor P2 is turned on, and the voltage at node T2 begins to increase. As a result, the output signal Vout shifts (decreases) to the level of the ground voltage Vss.

The conventional level shifter shown in FIG. 1 has problems of leakage current, reduced operating speed due to two steps of gate delay, and increased power consumption. For example, if the input signal Vin shifts from the level of the ground voltage Vss to the level of the first supply voltage V1, both the PMOS transistor P2 and the NMOS transistor N2 are turned on at the same time from a point in time when the input signal Vin shifts to the point of time when the voltage at node T1 increases and thus the PMOS transistor P2 is turned off. Therefore, leakage current occurs, flowing through the PMOS transistor P2 and the NMOS transistor N2, which are both on at the same time.

In another example, if the input signal Vin shifts from the level of the first supply voltage V1 to the level of the ground voltage Vss, both the PMOS transistor P1 and the NMOS transistor N1 are turned on at the same time from a point in time when the input signal Vin shifts to the point of time when the voltage at node T2 increases and thus the PMOS transistor P1 is turned off. Therefore, leakage current flows through the PMOS transistor P1 and the NMOS transistor N1, since both are both on. This generation of leakage currents in the level shifter slows operating speed and increases power consumption of the level shifter.

The conventional level shifter has two steps of gate delay for a level shift operations between input and output signals. For example, when the input signal Vin shifts from the level of the ground voltage Vss to the level of the first supply voltage V1, the voltage at node T2 decreases to turn on the PMOS transistor P1 and thus the voltage at node T1 increases to turn off PMOS transistor P2. Therefore, the conventional level shifter of FIG. 1 needs time for two steps of gate delay. Similarly, when the input signal Vin shifts from the level of the first supply voltage V1 to the level of the ground voltage Vss, the conventional level shifter again needs time for two steps of gate delay, since the voltage at node T1 decreases to turn on PMOS transistor P2 and then the voltage at the node T2 increases to turn off PMOS transistor P1. The time required for two steps of gate delay is another factor slowing operating speed of the conventional level shifter.

Due to the above factors slowing operation, the duty ratio of the conventional level shifter deteriorates substantially at frequencies generally above 500 MHz. Further, the conventional level shifter has substantial problems operating at frequencies above 1 GHz.

To explain the deterioration of the duty ratio, the point of time when the voltage at node T2 begins to decrease to the ground voltage Vss depends on only the NMOS transistor N2. On the other hand, the point of time when the voltage at node T2 begins to increase to the second supply voltage V2 depends on the time when the voltage at the node T1 decreases by the NMOS transistor N1 and thus when the PMOS transistor P2 is turned on. Consequently, there is a short time gap between the former and latter points of time. As a result, the duty ratio deteriorates considerably when the conventional level shifter operates at a high speed. In addition, a uniform duty ratio cannot easily be maintained.

In addition, PMOS transistors are generally designed to be larger than NMOS transistors. However, the conventional level shifter shown in FIG. 1 can only operate when the electric charges discharged from nodes T1 and T2 by the NMOS transistors N1 and N2 are greater than the electric charges charged to the nodes T1 and T2 by PMOS transistors P1 and P2. Accordingly, for the conventional level shifter the NMOS transistors are designed to be larger than the PMOS transistors, which renders the level shifter incapable of normal operations under certain conditions, such as a low supply voltage.

SUMMARY OF THE INVENTION

An example embodiment of the present invention is directed to a level shifter. The level shifter may include a pull-up signal generation unit outputting a pull-up signal at a voltage level that is a given voltage level higher than a voltage level of an input signal, a pull-up unit pulling-up an output signal in response to the pull-up signal so as to generate the output signal with a shifted level, and a pull-down unit pulling-down the output signal in response to the input signal.

Another example embodiment of the present invention is directed to a method of level shifting between an input signal and an output signal. In the method, a pull-up signal may be generated at a voltage level that is given amount higher than a voltage level of the input signal. The output signal may be pulled-down when the input signal is at a low level, and pulled-up using the pull-up signal when the input signal is at a high level. The level of the pulled-up output signal may be higher than a supply voltage of the input signal.

BRIEF DESCRIPTION OF THE DRAWINGS

Example embodiments of the present invention will become more fully understood from the detailed description given herein below and the accompanying drawings, wherein the like elements are represented by like reference numerals, which are given by way of illustration only and thus are not limitative of the example embodiments the present invention.

DETAILED DESCRIPTION OF THE EXAMPLE EMBODIMENTS

Figure 3:
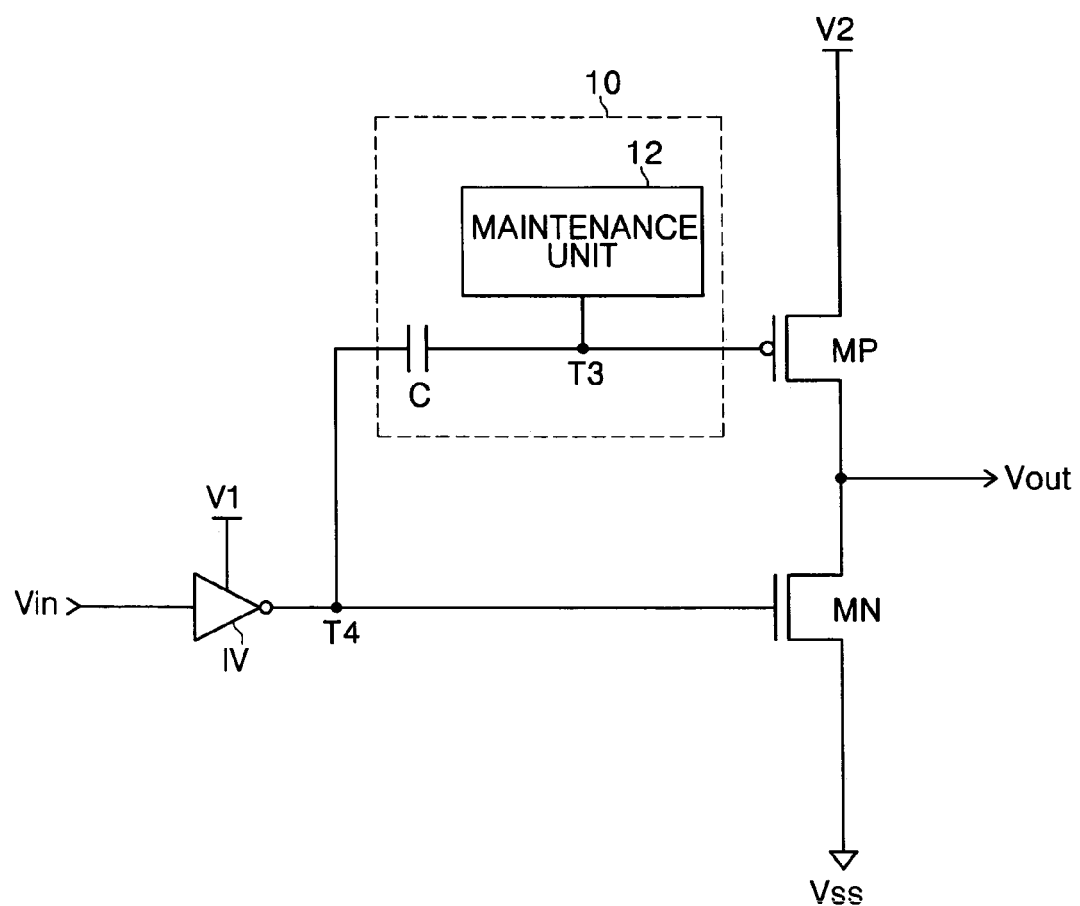
FIG. 3 is a block diagram of a level shifter according to an example embodiment of the present invention.

FIG. 3 is a block diagram of a level shifter according to an example embodiment of the present invention. As will described hereafter, the example level shifter may be configured to include pull-up signal generation unit for generating a pull-up signal, a pull-up unit for pulling-up an output signal in response to a pull-up signal, so as to generate the output signal with a shifted level, and a pull-down unit configured to pull-down the output signal in response to an input signal. The level shifter of FIG. 3 may include an inverter IV, a pull-up signal generation unit 10, a single PMOS transistor MP (pull-up-unit) and a single NMOS transistor MN (pull-down unit). In this example, the pull-up signal generation unit 10 may include a capacitor C and a maintenance unit 12. In FIG. 3, Vin refers to an input signal, Vout refers to an output signal, V1 refers to a first supply voltage, and V2 refers to a second supply voltage that may be higher than the first supply voltage V1.

Referring to FIG. 3 and in operation, the pull-up signal generation unit 10 may increase the level of an output signal of the inverter IV by a some given level that may be set in advance (hereafter this given or preset voltage level may also be referred to as a "given level" or "given, pre-set level") and may output the result as a pull-up signal at node T3. The pull-up signal may have the same phase as the output signal of the inverter IV (at node T4) but a reference level for the pull-up signal may be set to be higher than the output signal of the inverter IV by the given level.

The capacitor C may operate as a pumping unit, pumping the pull-up signal so as to synchronize phases of the pull-up signal with the output signal of the inverter IV. The maintenance unit 12 may be configured to maintain the reference level of the pull-up signal at a certain level.

For example, when the voltage at node T4 shifts, the reference level, (i.e., DC voltage level) of the pull-up signal, (i.e., a signal at node T3), may be uniformly maintained by maintenance unit 12. However, an AC component at node T4 transmitted to the node T3 by capacitor C. As a result, the pull-up signal (applied to a gate of the PMOS transistor MP) may become the output signal of the inverter IV, and may be at a voltage level that increases by the given, pre-set level.

Therefore, by a desired setting of selecting of the reference level (i.e., a DC voltage level) of the pull-up signal by the maintenance unit 12, the PMOS transistor MP may be turned on and off by a phase shift of the AC component of the output signal of the inverter IV, (i.e., a phase shift of the input signal Vin). In addition, the PMOS transistor MP and the NMOS transistor MN are not turned on at the same time under these conditions.

For example, when the level of the input signal Vin shifts from the level of the ground voltage Vss to the level of the first supply voltage V1, the voltage at node T4 from the level of the first supply voltage V1 to the level of the ground voltage Vss.

Therefore, the NMOS transistor MN is turned off, and the level of the pull-up signal, (i.e., the voltage at the node T3), decreases, by an amount equal to the level of the first supply voltage V1, from the level of the given voltage that has been set and maintained by the maintenance unit 12. This causes the PMOS transistor MP to be turned on. As a result of PMOS transistor MP being turned on, the level of the output signal Vout level shifts (increases) to the level of the second supply voltage V2. Since the time taken for the level increase depends on only the single PMOS transistor MP, the example level shifter of FIG. 3 has one step of gate delay for a shift to a level increase between Vin and Vout.

When the level of the input signal Vin shifts from the level of the first supply voltage V1 to the level of the ground voltage Vss, the voltage at node T4 shifts from the level of the ground voltage Vss to the level of the first supply voltage V1. Therefore, the NMOS transistor MN turns on, and the level of the pull-up signal, (i.e., the voltage at node T3), increases by an amount equal to the level of the first supply voltage V1. This causes the PMOS transistor MP to be turned off. As a result of PMOS transistor MP being off and NMOS transistor MN being on, the level of the output signal Vout level shifts (decreases) to equal the level of the ground voltage Vss. Since the time taken for the level decrease depends on only the NMOS transistor MN, the level shifter of FIG. 3 has only one step of gate delay for shift to a level decrease between Vin and Vout.

In other words, the example level shifter FIG. 3 has only one step of gate delay from the point of time when the input signal Vin shifts to the point of time when the output signal Vout shifts. This may lead to improved operating speed for the level shifter or for semiconductor devices employing the level shifter of FIG. 3.

As mentioned above, the example level shifter FIG. 3 includes a maintenance unit 12 maintaining the pull-up signal (i.e., the voltage at the node T3 at a desired or given DC level) so that the PMOS transistor MP and the NMOS transistor MN may not be turned on at the same time. In other words, the example level shifter FIG. 3 may substantially reduce and/or eliminate generation of leakage current, which may improve operating speed and/or reduce power consumption.

For the example level shifter shown in FIG. 3, only the PMOS transistor operates when the output signal level increases and only the NMOS transistor operates when the output signal level decreases. Therefore, the PMOS and NMOS transistors for the example level shifter of FIG. 3 may be any size, which may facilitate maintaining a uniform duty ratio of the level shifter.

Figure 4:
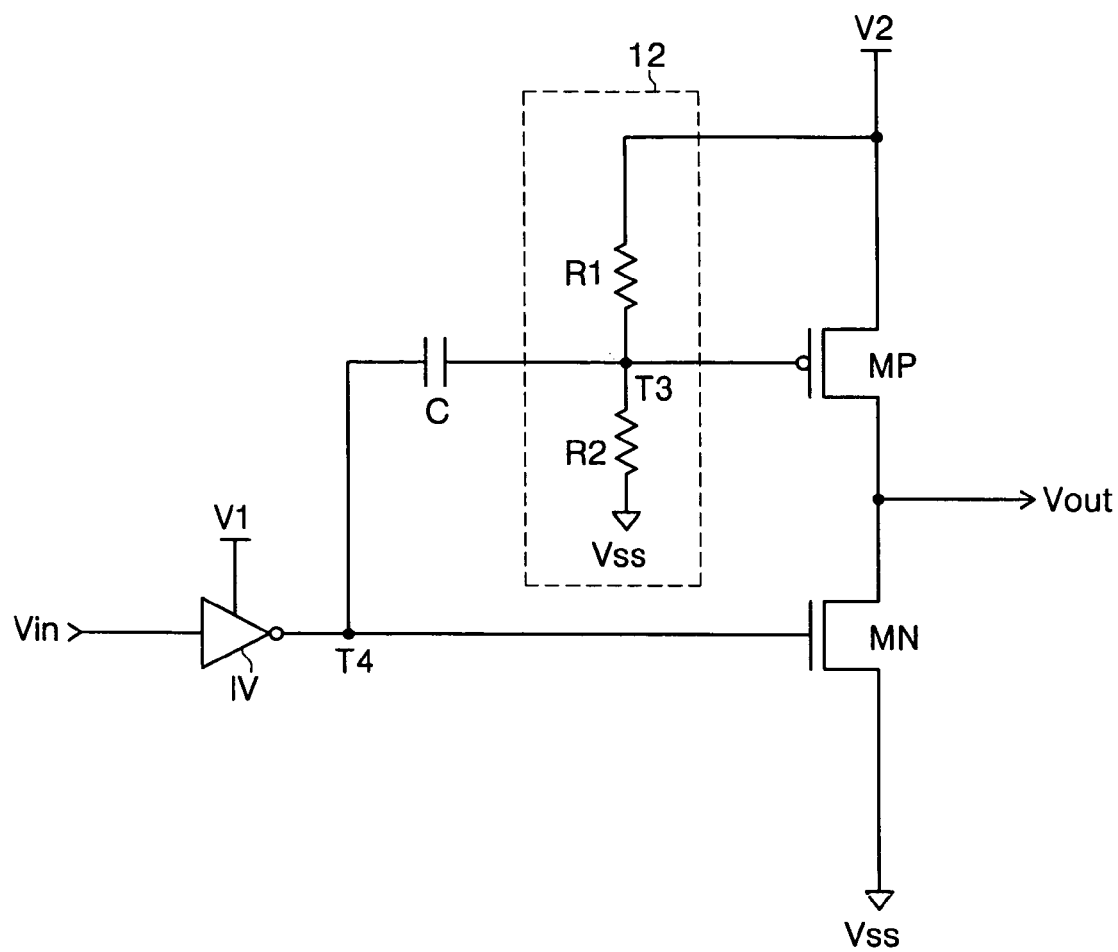
FIG. 4 is a circuit diagram of a level shifter according to another example embodiment of the present invention.

FIG. 4 is a circuit diagram of a level shifter according to another example embodiment of the present invention. Many of the components are similar to the level shifter described in FIG. 3, only differences are described herein. In FIG. 4 the maintenance unit 12 may include a first resistor R1 connected between the second supply voltage V2 and the node T3, and a second resistor R2 connected between node T3 and the ground voltage Vss.

The level shifter of FIG. 4 may operate basically in the same manner as described with reference to FIG. 3. Referring to the operation of the maintenance unit 12 in FIG. 4, the maintenance unit 12 sets the DC voltage of the pull-up signal, (i.e., a voltage at node T3), to the given voltage level by using resistors R1 and R2. For example, the maintenance unit 12 can maintain the DC voltage of the pull-up signal (i.e., the voltage at the node T3) at a voltage level value corresponding to the level of the second supply voltage V2, divided by a given voltage level value using the two resistors R1 and R2 (i.e., R1 and R2 form a voltage divider).

Figure 5:
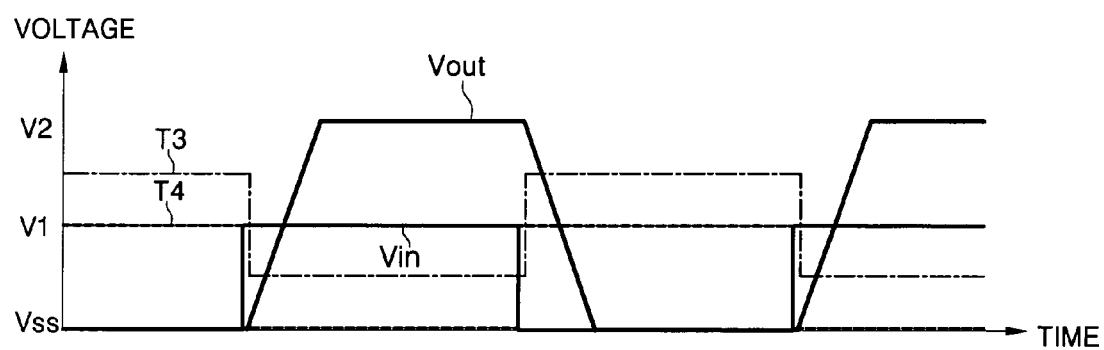
FIG. 5 is a timing diagram illustrating operation of the level shifter shown in FIG. 4.

FIG. 5 is a diagram illustrating the operation of the level shifter shown in FIG. 4. In FIG. 5, Vin refers to the input signal, Vout refers to the output signal, and T3 and T4 refer to the voltages at nodes T3 and T4, respectively. The voltage at node T3 represents the pull-up signal.

Referring to FIG. 5, when the input signal Vin shifts from the level of the ground voltage Vss to the level of a first supply voltage V1, the pull-up signal, (i.e., the voltage at node T3), decreases, by a voltage level amount equal to the level of the first supply voltage V1, from the voltage value being maintained by the maintenance unit 12. This causes the PMOS transistor MP to be turned on and thus the voltage of the output signal Vout is level shifted (increases) to V2, as shown in FIG. 5

As shown in FIG. 5, when the input signal Vin shifts from the level of the first supply voltage V1 to the level of the ground voltage Vss, the pull-up signal, (i.e., the voltage at the node T3), increases, by a voltage level amount equal to the first supply voltage V1. This causes the PMOS transistor MP to be turned off, and the voltage at node T4 becomes the level of the first supply voltage V1 so that the NMOS transistor MN is turned on. As a result, the output signal Vout is level shifted (decreased) to the level of the ground voltage Vss, as shown in FIG. 5.

Though not shown in the drawings, in order to meet an initial condition, the example level shifter in FIGS. 3 and/or 4 may additionally include a circuit which sets the voltage at the node T4 equal to the first supply voltage V1, at an initial stage of operation.

Figure 2:
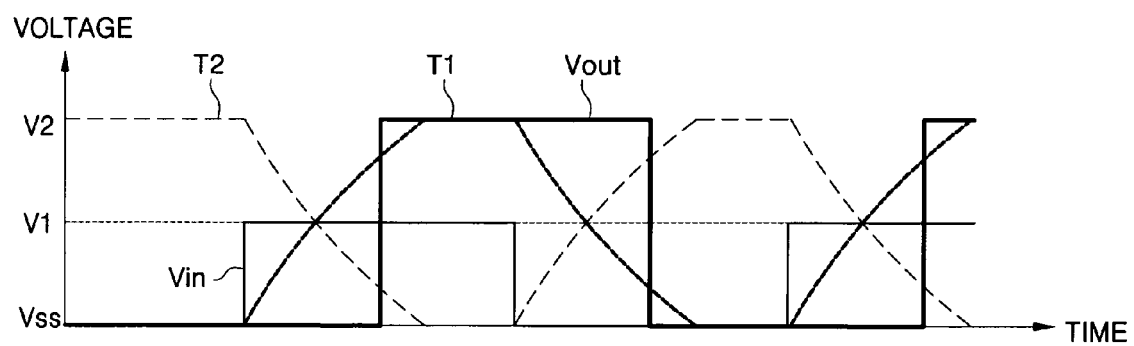
FIG. 2 is a timing diagram illustrating operation of the conventional level shifter shown in FIG. 1.

FIG. 5 illustrates that the operating speed of the level shifter may be improved. For example, as shown in FIG. 5 and with comparative reference to FIG. 2, the shifting time or duration between (i) the point in time when the input signal Vin shifts to the level of the first supply voltage V1, to (ii) the point of time when the output signal Vout shifts to the level of the second supply voltage V2, is reduced. This reduction in shifting time is because the level shifting is subject to the gate delay of only one transistor (MP or MN) and hence controlled by only one transistor MP or MN, depending on whether the level shift is from a high-to-low voltage transition between Vin and Vout (transistor MN controls) or from a low-to-high voltage transition between Vin and Vout (transistor MP controls). In addition, since the PMOS transistor MP and the NMOS transistor MN are not turned on at the same time, there is substantially little or no potential for generating leakage current, thus power consumption may also be reduced.

Figure 6:
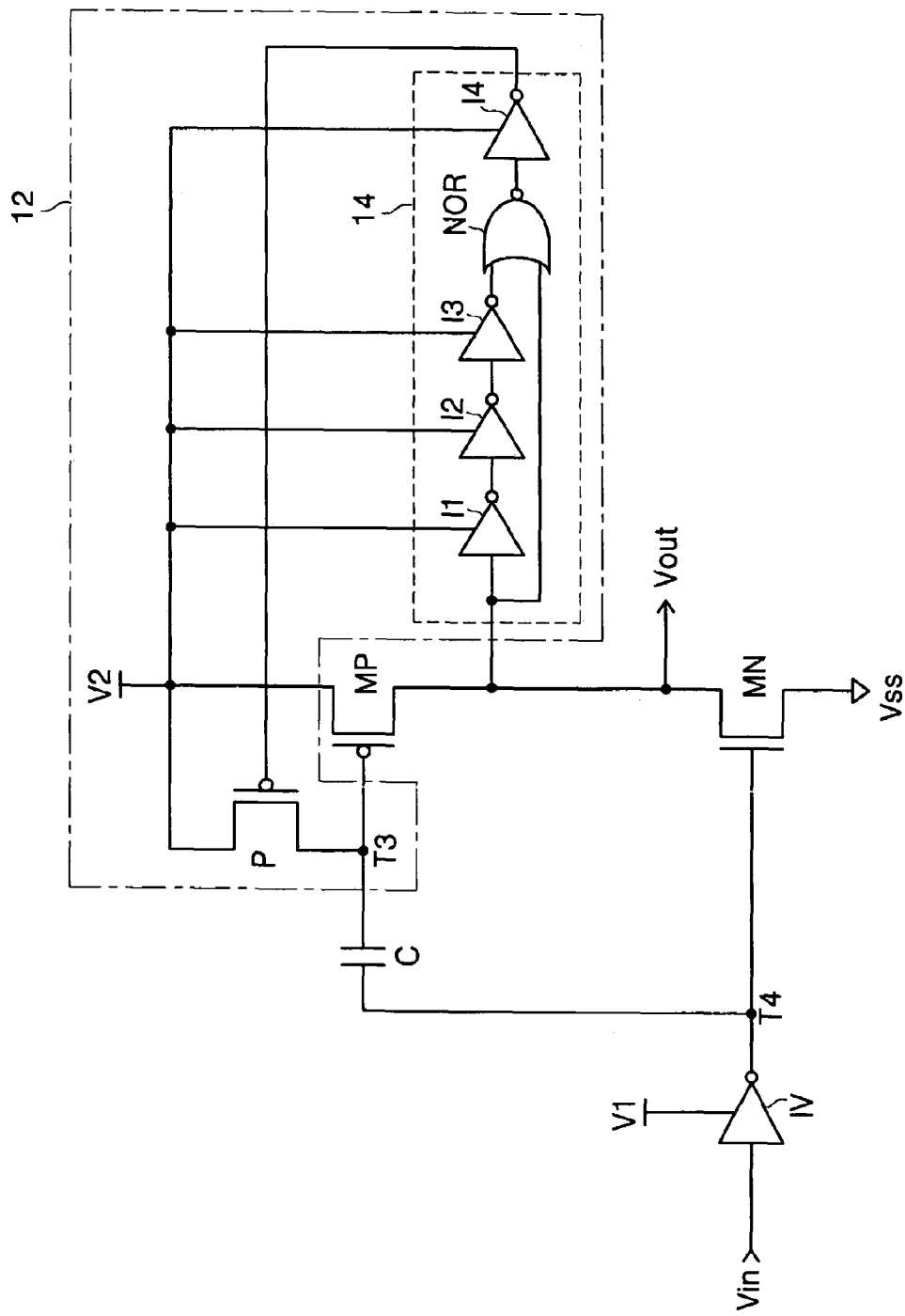
FIG. 6 is a circuit diagram of a level shifter according to another example embodiment of the present invention.

FIG. 6 is a circuit diagram of a level shifter according to another embodiment of the present invention. The maintenance unit 12 in FIG. 6 may include a PMOS transistor P, and a pulse generation unit 14. The pulse generation unit 14 may include inverters I1, I2, I3 and I4, and a NOR gate NOR. The remaining components may be the same as FIGS. 3 and 4.

The example level shifter of FIG. 6 may operate basically in the same manner as described with reference to the example level shifter of FIG. 3. Referring to the operation of the pulse generation unit 14 in FIG. 6, the pulse generation unit 14 may be configured to output a pulse signal having a given pulse width whenever the output signal Vout shifts from a high level, (i.e., the level of the second supply voltage V2), to a low level, (i.e., to the ground voltage Vss). For example, the pulse generation unit 14 may perform a NOR operation on the output signal Vout and on a signal that has been delayed for a given time using the three inverters I1, I2 and I3, as shown in FIG. 6, so as to output the pulse signal. In response to the pulse signal, the PMOS transistor P may asset the voltage at node T3 equal to the second supply voltage V2.

Therefore, the example maintenance unit 12 of FIG. 6 may set the voltage at node T3 equal to the second supply voltage V2, each time the output signal Vout shifts from the level of the second supply voltage V2 to the level of the ground voltage Vss.

Though not shown in the drawings, the level shifter in any of FIGS. 3, 4 and 6 may further include a circuit for setting the level of node T3 equal to the second supply voltage V2 again, when the input signal Vin is kept at a low level, (i.e., the ground voltage Vss) for a period or duration that exceed some threshold or given time period, for example.

Figure 7:
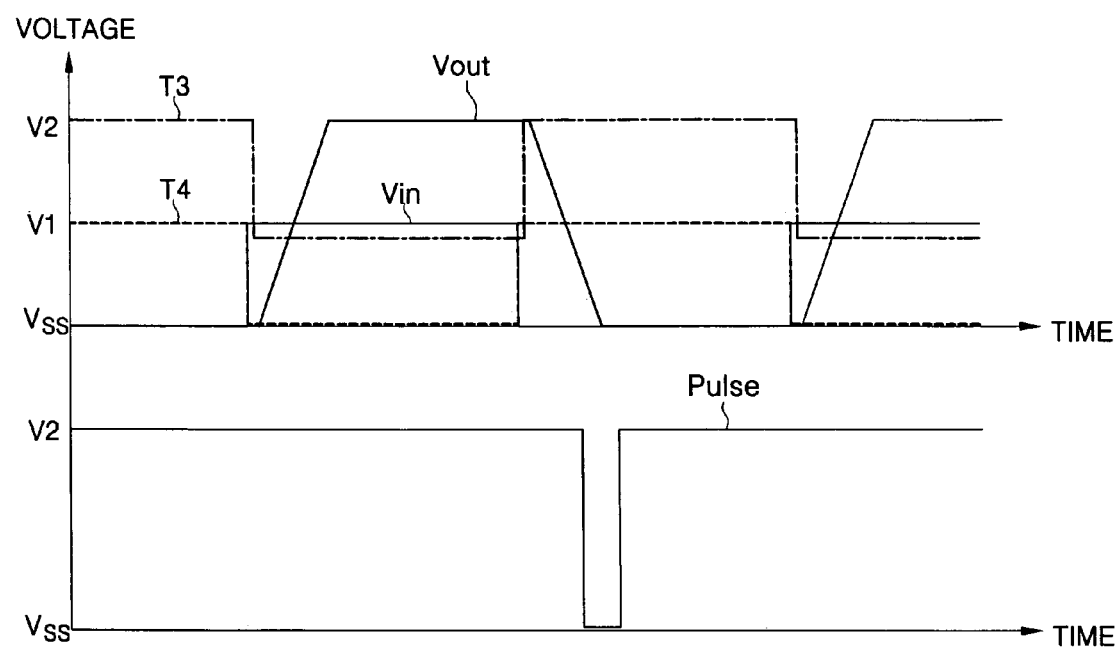
FIG. 7 is a timing diagram illustrating operation of the level shifter shown in FIG. 6.

FIG. 7 is a timing diagram illustrating the operation of the example level shifter of FIG. 6. In FIG. 7, Vin is the input signal, Vout is the output signal, T3 and T4 refer to voltages at nodes T3 and T4 respectively, and Pulse refers to a pulse signal output from the pulse generation unit 14. The voltage at node T3 represents the pull-up signal.

Referring to FIG. 7, when the input signal Vin shifts from the level of the ground voltage Vss to the level of the first supply voltage V1, the voltage at node T4 shifts from the level of the first supply voltage V1 to the level of the ground voltage Vss. Therefore, the NMOS transistor MN is turned off. On the other hand, since the voltage at node T3 decreases, by an amount that is equal to the voltage level of the first supply voltage V1, from the level of the second supply voltage V2 as shown in FIG. 7, the PMOS transistor MP is turned on. As a result, the output signal Vout is level shifted from the level of the ground voltage Vss to the level of the second supply voltage V2, as shown in FIG. 7.

When the input signal Vin shifts from the level of the first supply voltage V1 to the level of the ground voltage Vss, the voltage at node T3 again increases by a voltage level equal to the first supply voltage V1 again. This causes PMOS transistor MP to be turned off. On the other hand, since the voltage at node T4 shifts from the level of the ground voltage Vss to the level of the first supply voltage V1, the NMOS transistor MN is turned on. As a result, the output signal Vout is level shifted from the level of the second supply voltage V2 to the level of the ground voltage Vss.

When the output signal Vout shifts from the level of the second supply voltage V2 to the level of the ground voltage Vss, the pulse signal Pulse output at its given pulse width. Since the PMOS transistor MP is turned on for a given time period based on the pulse signal Pulse, the voltage at node T3 shifts to the level of the second supply voltage V2 and is maintained at that level unless the input signal Vin shifts.

Figure 8A:
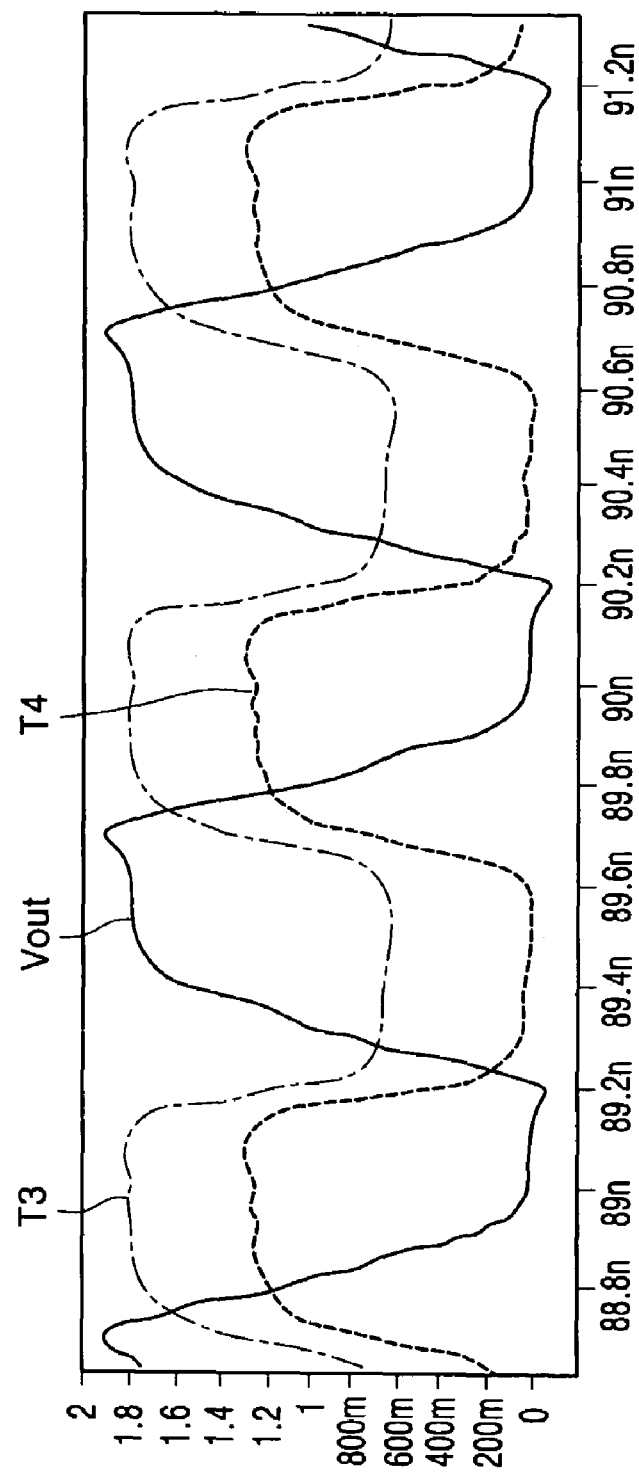
FIGS. 8A and 8B are diagrams illustrating simulation results for a level shifter according to an example embodiment of the present invention.
Figure 8B:
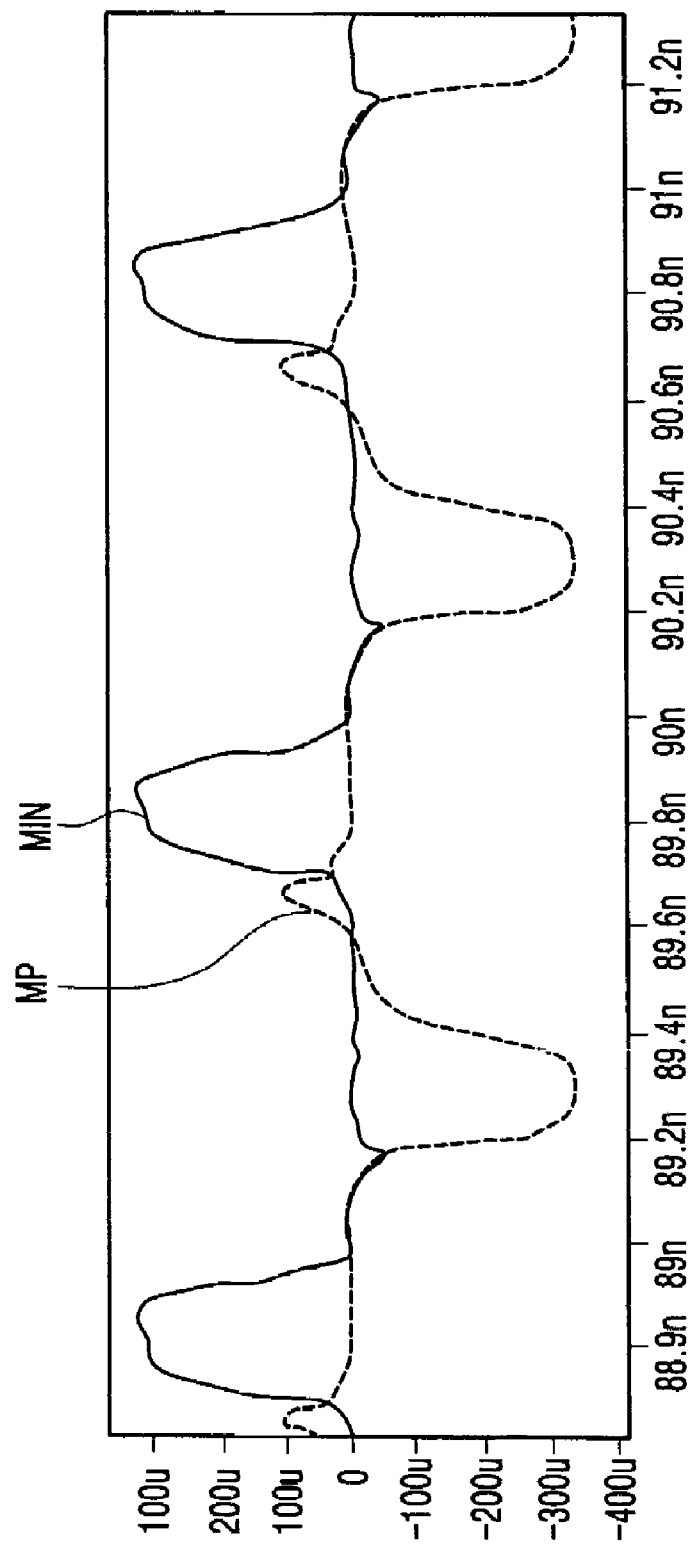

FIGS. 8A and 8B are diagrams illustrating simulation results for an level shifter according to an example embodiment of the present invention. The simulation was conducted with an input signal Vin having a frequency of 1 GHz, a first supply voltage V1 of 1.3V, and a second supply voltage V2 of 1.8V. FIG. 8A shows changes in the voltages of nodes T3 and T4 and the output signal Vout, while FIG. 8B shows changes in the currents flowing through the PMOS transistor MP and the NMOS transistor MN. The voltage at node T3 represents the pull-up signal.

Figure 1:
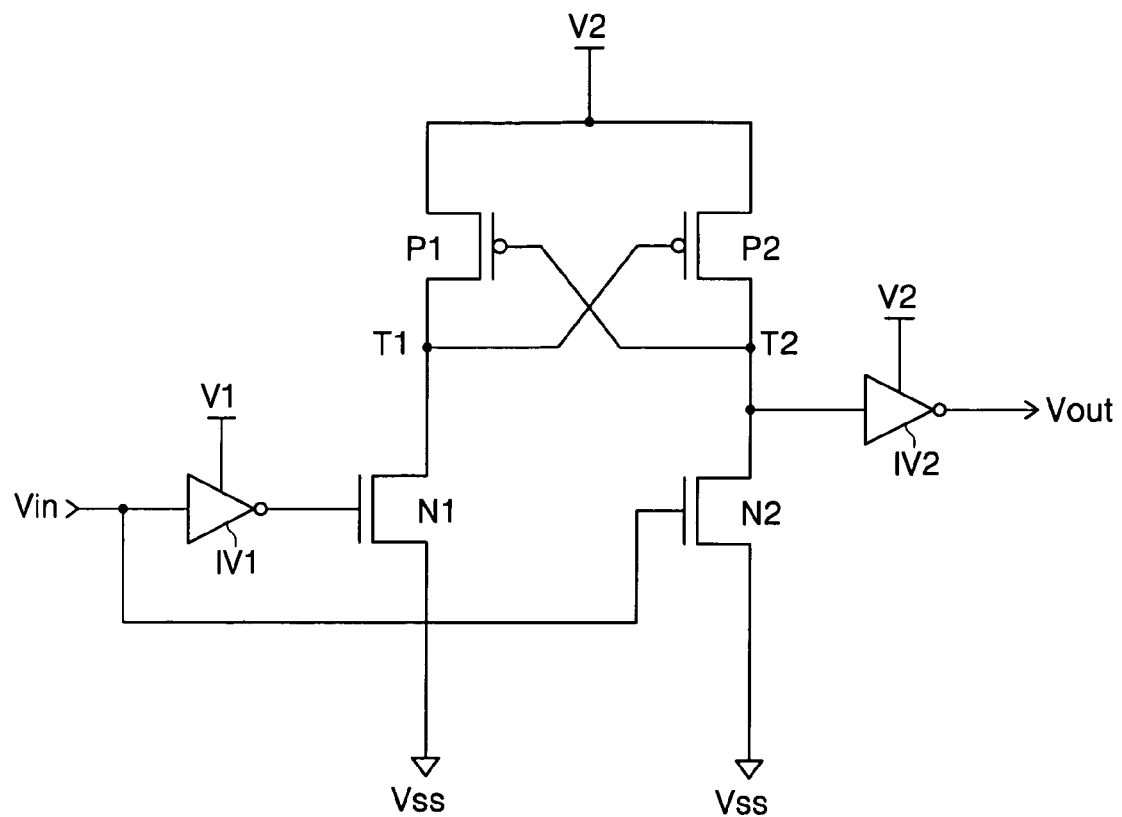
FIG. 1 is a circuit diagram of a conventional level shifter according to an example embodiment of the present invention.

As previously discussed, the conventional level shifter of FIG. 1 has substantial difficulty operating normally when the input signal Vin has a frequency above 1 GHz. However, as shown in FIG. 8A, the level shifter described in accordance with the example embodiments in any of FIGS. 3, 4 and/or 6 may operate normally even when the input signal Vin has a frequency of 1 GHz.

In addition, and referring to FIG. 8B, current does not flow through the PMOS transistor MP and the NMOS transistor MN simultaneously. Thus, since the PMOS transistor MP and the NMOS transistor MN are not turned on at the same time, there is no leakage current, which may lead to improvements in operating speed and reductions in power consumption.

Since the period of time or duration from the point of time when the input signal Vin shifts from the level of the ground voltage Vss to the level of the first supply voltage V1, to the point of time when the output signal Vout shifts from the level of the ground voltage Vss to the level of the second supply voltage V2 depends on only one transistor, instead of two, the example level shifters as described in FIGS. 3, 4 and/or 6 have only a single step of gate delay. This may lead to improved operating speed, for example.

In addition, when the level of the output signal Vout shifts, only one of the PMOS transistor MP and NMOS transistor MN may operate, so that the PMOS transistor MP and the NMOS transistor MN may be designed at any size. Therefore, this may facilitate a uniform duty ratio for the level shifters described in accordance with the example embodiments of the present invention.

Described above is a case in which the input signal Vin may be inverted by the inverter IV so that the output signal Vout and the input signal Vin have the same phase. However, where an output signal Vout having an inverse phase is used, there may be no need for the inverter IV. In other words, it may be possible to modify the level shifter as described in any of FIGS. 3, 4 and/or 6 to omit the inverter IV.

In addition, in the above-described case, in order to match the phases of the output signal Vout and the input signal Vin, the inverter IV may be disposed at the input terminal to which the input signal Vin may be applied. However, in an alternative construction the inverter IV may be disposed at the output terminal from which the output signal Vout is output. In other words, it may be possible to invert the output signal Vout using the inverter IV, instead of inverting the input signal Vin. In this example, the level of the supply voltage applied to the inverter may be the level of the second supply voltage V2.

Although in the example embodiments hereinabove the pull-up unit has been described as a PMOS transistor, the pull-down unit as an NMOS transistor, and the pumping unit as capacitor C, other constructions and components could be used in the example embodiments for the pull-up, pull-down and pumping units. For example, other types of transistors could be used for the pull-up and pull-down circuits other than PMOS and/or NMOS transistors, and other known circuits could be employed as a pumping unit in place of the capacitor C.

While example embodiments of the present invention have been particularly shown and described, it will be understood by those of ordinary skill in the art that various changes in form and details may be made therein without departing from the spirit and scope of the example embodiments of the present invention, as defined by the following claims.

What is claimed is:

1. A level shifter, comprising:
a pull-up signal generation unit outputting a pull-up signal at a voltage level that is a given voltage level higher than a voltage level of an input signal, the pull-up signal generation unit including
a pumping unit for pumping the pull-up signal so that the pull-up signal and the input signal have the same phase, and
a maintenance unit maintaining a reference level of the pull-up signal at a given, set voltage level;
a pull-up unit pulling-up an output signal in response to the pull-up signal to generate the output signal with a shifted level; and a pull-down unit pulling-down the output signal in response to the input signal, and wherein the maintenance unit includes
  a pulse generation unit outputting a pulse signal at a given pulse width in response to the output signal, as the output signal shifts from the shifted level to a ground voltage, and
  a level shifting unit shifting the reference level of the pull-up signal to equal the shifted level of the output signal, in response to the pulse signal.

2. The level shifter of claim 1, wherein the pull-up unit includes a PMOS transistor connected between a supply voltage terminal and an output terminal from which the output signal is output and including a gate to which the pull-up signal is applied, and the level of the supply voltage from the supply voltage terminal is higher than another supply voltage level of the input signal.

3. The level shifter of claim 1, wherein the pull-down unit includes:
  an NMOS transistor connected between a ground voltage terminal and an output terminal outputting the output signal, and including a gate to which the input signal is applied.

4. The level shifter of claim 1, wherein the pumping unit includes:
  a capacitor connected between an input terminal to which the input signal is applied and the maintenance unit.

5. The level shifter of claim 1, wherein the level shifting unit includes a PMOS transistor connected between a supply voltage terminal and an output terminal of the pumping unit, and having a gate to which the pulse signal is applied, and wherein the level of the supply voltage from the supply voltage terminal is higher than another supply voltage level of the input signal.

6. The level shifter of claim 1, wherein the pulse generation unit includes:
  a delay unit delaying the output signal for a given time period;
  a NOR gate performing a NOR operation on the output signal and an output signal of the delay unit; and
  an inverter inverting an output signal of the NOR gate to output the inverted signal as the pulse signal.

7. The level shifter of claim 6, wherein the delay unit includes an odd number of inverters connected in series between the NOR gate and an output terminal from which the output signal is output.

8. The level shifter of claim 1, further comprising:
  an inverter inverting a signal received externally and outputting the inverted signal as the input signal.

9. The level shifter of claim 1, further comprising
  an inverter inverting the output signal and outputting the inverted signal.

10. A method of level shifting between an input signal and an output signal, comprising:
  generating a pull-up signal at a voltage level that is given amount higher than a voltage level of the input signal, the generating a pull-up signal step including
    setting a reference level of the pull-up signal equal to a given, set voltage level, and
    pumping the pull-up signal such that the pull-up signal and the input signal have the same phase; and
  pulling-down the output signal when the input signal is at a low level, and pulling-up the output signal using the pull-up signal when the input signal is at a high level,
  wherein the level of the pulled-up output signal is higher than a supply voltage of the input signal, and
  the setting a reference level of the pull-up signal equal to the given, set voltage level step includes
    generating a pulse signal having a given width when the output signal is pulled-down, and
    setting the reference level of the pull-up signal equal to the given, set voltage level in response to the pulse signal.

11. The method of claim 10, further comprising:
  inverting an externally received signal and outputting the inverted signal as the input signal.

12. The method of claim 10, further comprising:
  inverting the output signal and outputting the inverted signal.

* * * * *